United States Patent
Hansson

(10) Patent No.: US 6,442,579 B1
(45) Date of Patent: Aug. 27, 2002

(54) LOW POWER LINEAR FEEDBACK SHIFT REGISTERS

(75) Inventor: Mattias Hansson, Lund (SE)

(73) Assignee: Telefonaktiebolaget LM Ericsson, Stockholm (SE)

( * ) Notice: Subject to any disclaimer, the term of this patent is extended or adjusted under 35 U.S.C. 154(b) by 0 days.

(21) Appl. No.: 09/310,753

(22) Filed: May 13, 1999

(30) Foreign Application Priority Data

May 18, 1998 (SE) .............................................. 9801781

(51) Int. Cl.⁷ ................................................. G06F 1/02
(52) U.S. Cl. ............................ 708/252; 377/72; 377/78
(58) Field of Search ........................... 708/252; 377/72, 377/73, 76, 78

(56) References Cited

U.S. PATENT DOCUMENTS

| | | | |
|---|---|---|---|
| 5,090,035 A | 2/1992 | Murase | 377/72 |
| 5,295,174 A | 3/1994 | Shimizu | 377/76 |
| 5,867,409 A * | 2/1999 | Nozuyama | 377/72 |
| 5,974,433 A * | 10/1999 | Currie | 708/252 |
| 6,014,408 A * | 1/2000 | Naruse et al. | 708/252 |

\* cited by examiner

*Primary Examiner*—David H. Malzahn
(74) *Attorney, Agent, or Firm*—Burns, Doane, Swecker & Mathis, L.L.P.

(57) ABSTRACT

A low power linear feedback shift register includes an ordered set of register steps including memory devices. Enabling devices enable a single current memory device at every shift operation. Each register step includes a lower power memory device consuming a minimum amount of power when disabled, and a feedback device, an output terminal thereof being connected to an input terminal of the memory device, the feedback device having first and second input terminals connected to an output terminal of the memory device and an output terminal of a second subsequent memory device, respectively, in the set. The output terminal of each memory device is connected to a selection device, selecting at every shift operation the output terminal of a first subsequent memory device following the current memory device being enabled at the current shift operation.

6 Claims, 3 Drawing Sheets

US 6,442,579 B1

LOW POWER LINEAR FEEDBACK SHIFT REGISTERS

This application claims priority under 35 U.S.C. §§ 119 and/or 365 to 9801781-7 filed in Sweden on May 18, 1998; the entire content of which is hereby incorporated by reference.

The present invention relates to shift registers and more particularly to low power linear feedback shift registers.

BACKGROUND

Linear feedback shift registers (LFSR) are used in many different electronic apparatuses such as computers, calculators, personal organisers mobile phones etc.

A register is normally used as a storage for a set of information, usually a binary word. Conventionally, an n-bit register is an ordered set of n flip-flops used to store an n-bit word. Each bit of the word is stored in a separate flip-flop. Registers where the words or data transferred to or from the register in parallel are usually designed with D latches or D flip-flops. A widely used register design organized to allow left- or right-shift operations of the stored information is called a shift register. An n-bit shift register may consist of n D flip-flops each of which is connected to its left and/or right neighbour. Data may be entered 1 bit at a time at one end of the register and may be read 1 bit at a time from the other end, which is called serial input-output. A right shift of a D flip-flop shift register is achieved by enabling the clock input of each flip-flop.

A problem with the above mentioned prior art shift register designs is that when they are used in applications or apparatuses, such as mobile phones, where power consumption is critical, the power consumption in the flip-flops in the shift registers is a considerable portion of the total power consumption in the current apparatus.

However, U.S. Pat. No. 5,295,174 discloses a shifting circuit having lower power consumption and a shift register employing the same. The shift register comprises a plurality of latch circuits, a multiplexer for selecting outputs of the latch circuits in sequence, and a clock control circuit for generating clocks used for controlling selection timings of the multiplexer, wherein the timing for selecting the output of a certain latch circuit is delayed with respect to the latch timing of the certain latch circuit by a predetermined timing.

SUMMARY OF THE INVENTION

An object of the present invention is to provide an improved linear feedback shift register (LFSR) reducing the power consumption problem.

This is accomplished by a low power linear feedback shift register according to the invention, using memory means such as flip-flops not consuming power when they are disabled. The register does not shift any bits but still generates the same sequence as a conventional linear feedback shift register.

The register comprises enabling means enabling a single current memory means at every shift operation, register steps, each comprising a low power memory means consuming a minimum of power when it is disabled, and feedback means of each step. Each memory means is connected to selection means, selecting at every shift operation the output terminal of a first subsequent memory means following the current memory means being enabled at the current shift operation.

Another object of the present invention is to provide said enabling means.

Still another object of the invention is to provide said selection means.

An advantage of the low power linear feedback shift register according to the invention is the reduction in power consumption.

BRIEF DESCRIPTION OF THE DRAWINGS

In order to explain the invention in more detail and the advantages and features of the invention preferred embodiments will be described in detail below, reference being made to the accompanying drawings, in which.

DETAILED DESCRIPTION OF THE INVENTION

Figure 1:
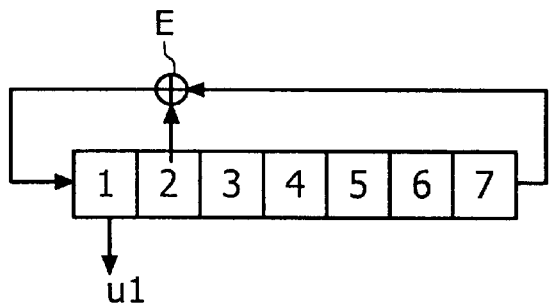
FIG. 1 is a schematical block diagram of a prior art linear feedback shift register (LFSR), a first flip-flop of which is updated with a feedback value.
Figure 2:
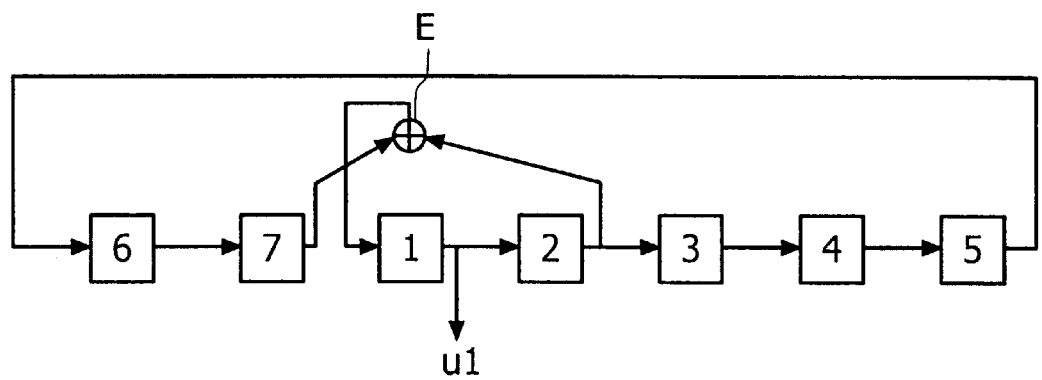
FIG. 2 is a schematical block diagram of the shift register (LFSR) in FIG. 1 in further detail.

A conventional prior art 7-position shift register comprising seven flip-flops 1–7 connected in series is shown in FIG. 1 and in further detail in FIG. 2. The shift register is provided with a simple feedback by means of an EXOR (Exclusive-OR) gate E having first and second input terminals connected to the output terminal of the second flip-flop 2 and seventh flip-flop 7, respectively. An output terminal of the EXOR gate E is connected to an input terminal of the first flip-flop 1, an output of which is connected to an output terminal or u1 of the register. This kind of shift register is called a linear feedback shift register (LFSR).

In the following description, numerous specific details, such as the number of positions in the register or the feedback polynomial, are provided in order to give a more thorough description of the present invention. It will be obvious for those skilled in the art that the present invention may be practiced without these specific details. Some well-known features are not described in detail so as not to make the present invention unclear.

Considering a steady state for the register in FIG. 2, when the register is to be updated, each flip-flop 2–7 is updated with the value on the output terminal of the flip-flop in the preceding position. However, in the first position the flip-flop 1 is updated with the feedback value from the output terminal of the EXOR gate E.

A low power LFSR according to the invention is accomplished by a conversion of the conventional prior art LFSR illustrated in FIG. 2.

Figure 3:
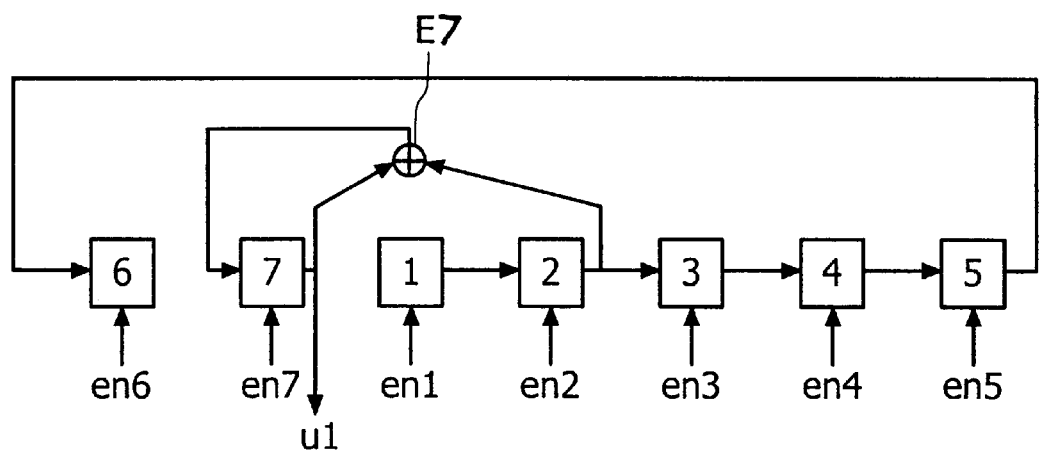
FIG. 3 is a schematical block diagram of a first modification of the shift register (LFSR) in FIG. 2.

A first step of the conversion is illustrated in FIG. 3, in which the feedback is arranged one step to the left and, hence, an output terminal of an EXOR gate E7 is connected to an input terminal of the seventh flip-flop 7. Further, the EXOR gate E7 has first and second input terminals connected to the output of the flip-flop 2 and the flip-flop 7, as described. Consequently, the output terminal of the flip-flop 7 is connected to the output terminal u1 of the register. The output value from the output terminal u1 in the modified LFSR shown in FIG. 3 corresponds to the output value of the output terminal u1 in the conventional prior art LFSR illustrated in FIG. 2 after a one bit right shift operation. Additionally, each flip-flop 1–7 is provided with an enable input connection en1–en7, respectively, in order to control which flip-flop to be updated. Additionally, each flip-flop 1–7 has a clock input connection, not shown in the drawings.

Figure 4:
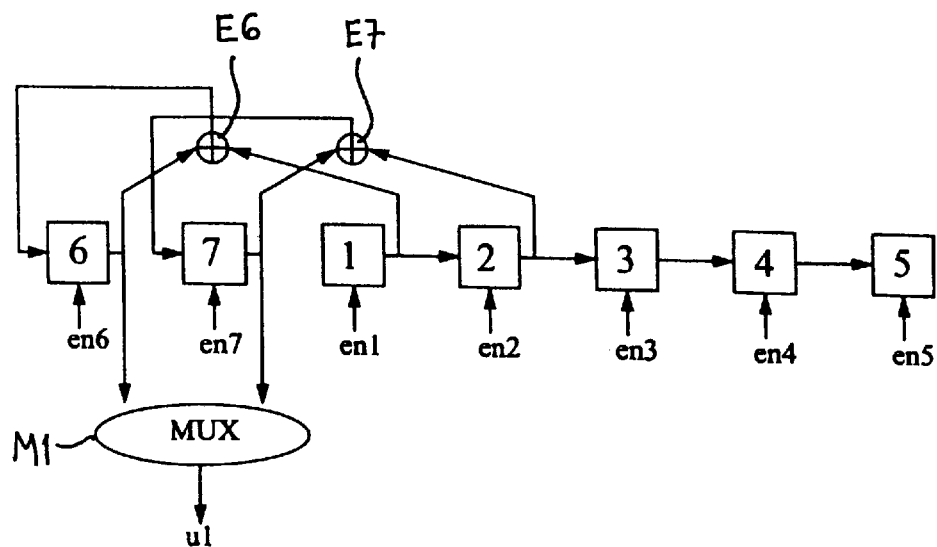
FIG. 4 is a schematical block diagram of a second modification of the shift register (LFSR) in FIG. 2.

In a second step of the conversion illustrated in FIG. 4, an output terminal of another EXOR gate E6 is connected to an input terminal of the flip-flop 6, the output terminal thereof being connected to the output terminal u1 of the register, and the EXOR gate E6 has first and second input terminals connected to the output of the flip-flop 1 and the flip-flop 6, respectively. This second feedback is necessary since the bit values in the register are not really shifted. The output value from the output terminal u1 in the modified LFSR shown in FIG. 4 is the output value from flip-flop 6 and corresponds to the output value of the output terminal u1 in the conventional prior art LFSR illustrated in FIG. 2 after a another right bit shift operation.

However, in order to choose the correct output terminal, i.e the output terminal of the sixth flip-flop 6, two input terminals of a selection means such as a MUX (Multiplexer) M1 is connected to the output terminals of the two flip-flops 6 and 7. In order to provide a correct output value after a first "shift" operation the flip-flop 6 is enabled and the output value on the flip-flop 7 is allowed to pass the MUX M1, and after a second "shift" operation the output of the flip-flop 6 is allowed to pass the MUX M1.

Figure 5:
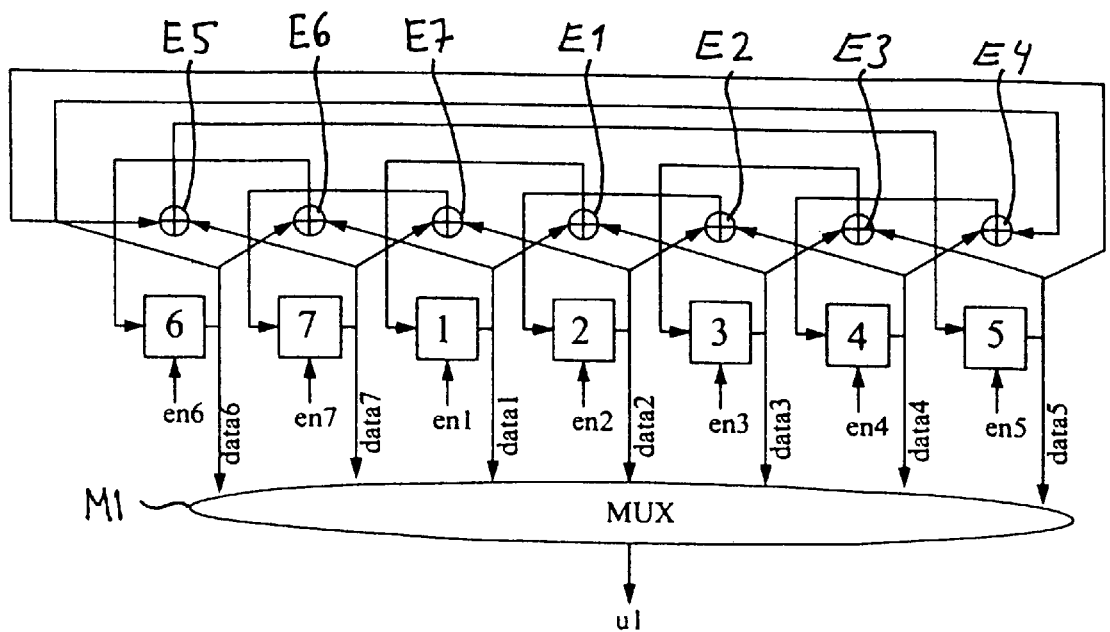
FIG. 5 is a schematical block diagram of an embodiment of a shift register (LFSR) according to the invention.

A completely converted conventional LFSR, i.e. an embodiment of a low power 7-step LFSR according to the present invention is shown in FIG. 5. The LFSR comprises seven flip-flops 1–7, seven EXOR gates E1–E7 for the feedback arrangements, and a MUX M1 provided with seven input terminals data1–data7 from the flip-flops and an output terminal u1. During a first shift operation the enable input of flip-flop 1 is activated via the enable input e1 and the MUX M1 allows the output data2 from the flip-flop 2 to pass as the current output value u1. A second shift operation involves an activation of the enable input e2 of the flip-flop 2 and the MUX M1 allows the output data3 from the flip-flop 3 to pass as the current output value u1 and so on for every step.

Thus, only one of the flip-flops in the LFSR register according to the invention is enabled or activated during each shift operation, and as a result the low power LFSR according to the invention generates the same output bit sequence as a conventional LFSR. This lower flip-flop activity causes less power loss and, further, the longer the shift register and the smaller the feedback the more efficient is the low power LFSR according to the invention.

In a register of an arbitrary length n having a feed-back polynomial of the same degree as the present feedback, the LFSR comprises n flip-flops 1–n, n EXOR gates E1–En for the feedback arrangements, and a MUX M1 provided with n input terminals data1-datan and an output terminal u1. If i=n−1 . . . 1, during a first shift operation the enable input of flip-flop i is activated via the enable input and the MUX M1 allows the output data(i+1) from the flip-flop i+1 to pass as the current output value u1. However, if i=n a shift operation involves an activation of the enable input of the flip-flop n and the MUX M1 allows the output data1 from the flip-flop 1 to pass as the current output value u1.

In order to generate the enable signals to the flip-flops, one after the other, enabling means such as a low power one-hot coded finite state machine (fsm) with n steps is used. An n-step fsm comprises n flip-flops F1–Fn and n NOR gates N1–Nn.

Each flip-flop in the fsm has a clock input connection, not shown in the drawings, an enable input connection $\overline{en}$ (activated by a 0 value), a data input connection d, and a data output connection q. If i=1 . . . n, the data output connection d of a flip-flop Fi is connected to a first input terminal of a NOR gate Ni, an output terminal thereof being connected to the enable input connection $\overline{en}$ of the flip-flop Fi, the data input terminal of the flip-flop F(i−1) (Fn if i=1), and a second input of the NOR gate N(i−1) (Nn if i=1). The output terminal of the flip-flop Fi is also connected to the enable input eni (en1–en7) of the flip-flop i in the low power LFSR according to the invention.

Figure 6:
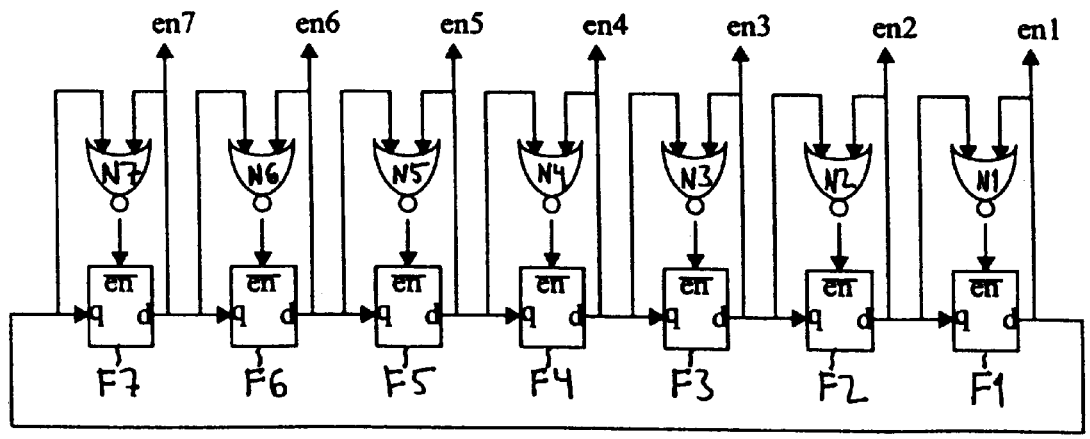
FIG. 6 shows a low power one-hot coded FSM.

An embodiment of a 7-step fsm for connection to and control of the low-power LFSR illustrated in FIG. 5 is shown in FIG. 6. The 7-step fsm comprises seven flip-flops F1–F7 and seven NOR gates N1–N7 connected as described above.

Figure 7:
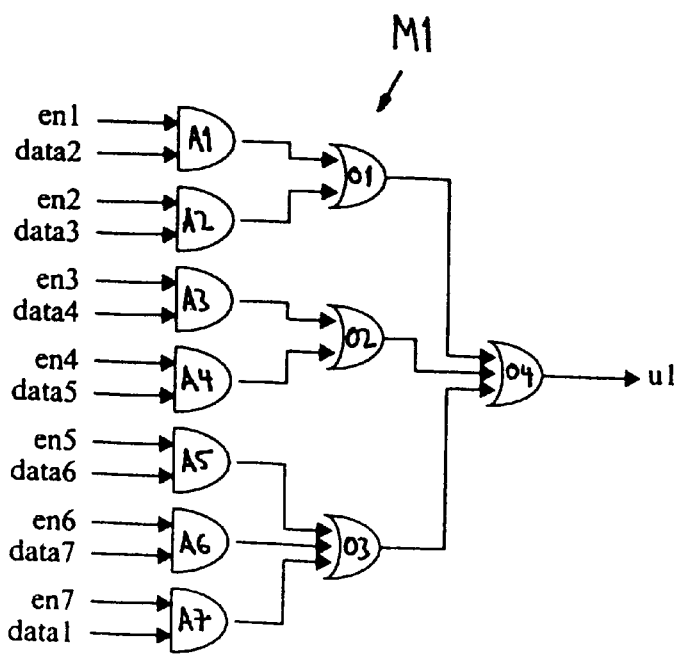
FIG. 7 shows an embodiment of a multiplexer of the shift register in FIG. 5 controlled by a one-hot coded FSM.

The fsm is also used to control the MUX M1. An embodiment of the MUX M1 is shown in FIG. 7. It comprises seven AND gates A1–A7 and four OR gates O1–O4. The main function of the MUX M1 is that the enable signal en1 causes the data2 to be the current output signal on u1 and en2 causes the data3 to be the current output signal on u1 and so on until en7 which causes the data1 to be the current output signal on u1.

Thus, it should be apparent that the present invention provides an LFSR that fully satisfies the aims and advantages set forth above. Although the invention has been described in conjunction with specific embodiments thereof, alternatives, modifications and variations are apparent to those skilled in the art.

For example, a conventional LFRS as shown in FIGS. 1 and 2 may have a different feedback polynomial such as and additional EXOR gate having first and second input terminals connected to the output of the flip-flop 6 and the flip-flop 7. Instead of the output terminal of flip-flop 7 an output terminal of the additional EXOR gate is connected to the second input terminal of the EXOR E. A conversion of the LFSR provided with this different feedback polynomial into a low power LFSR according to the invention is accomplished by a similar conversion of the conventional prior art LFSR as described for the conventional LFSR shown in FIGS. 1 and 2, in which memory means such as flip-flops not consuming power when they are disabled are used, and wherein the register does not shift any bits but still generates the same sequence as the conventional linear feedback shift register. However, in one embodiment of an LFSR provided with this different feedback polynomial another seven EXOR gates are needed for the design.

What is claimed is:

1. A low power linear feedback shift register comprising:
an ordered set of memory means, each memory means consuming a minimum amount of power when disabled;
enabling means for enabling a single current memory means at every shift operation; and
feedback means associated with each memory means, such that an output terminal is connected to an input terminal of the memory means and at least first and second input terminals are connected to an output terminal of the memory means and an output terminal of a second subsequent memory means in the ordered set, respectively, wherein the output terminal of each memory means is also connected to a selection means for selecting at every shift operation the output terminal of a first subsequent memory means following the current memory means being enabled at the current shift operation.

2. A low power linear feedback shift register according to claim 1, wherein the enabling means enables a single current memory means at every shift operation.

3. A low power linear feedback shift register according to claim 1, wherein the enabling means comprises:

an ordered set of low power memory means, each with a corresponding NOR gate, each memory means comprising a data output connection connected to a first input terminal of the corresponding NOR gate, a second input of a subsequent NOR gate, and a data input terminal of a subsequent memory means of the set, wherein an output terminal of the corresponding NOR gate is connected to an enable input connection of the corresponding memory means.

4. A low power linear feedback shift register according to claim 1, further comprising:

selection means comprising one or more AND gates and one or more OR gates, wherein an enable signal generated by the enable means for a particular memory means and a data output terminal of a subsequent memory means of the set are connected to first and second input terminals of a respective one of the AND-gates, and the output terminal of the respective AND gate is connected an input terminal of a respective OR gate, the output of which is the current output signal of the register.

5. A low power linear feedback shift register according to claim 1, wherein each memory means comprises a flip-flop.

6. A low power linear feedback shift register according to claim 1, wherein the feedback means comprise a feedback EXOR gate associated with each memory means.

* * * * *